US011369033B1

(12) United States Patent
Tsorng et al.

(10) Patent No.: US 11,369,033 B1
(45) Date of Patent: Jun. 21, 2022

(54) TOOL-LESS INSTALLATION STRUCTURE FOR DUAL SLOT PCIE CARD

(71) Applicant: Quanta Computer Inc., Taoyuan (TW)

(72) Inventors: Yaw-Tzorng Tsorng, Taoyuan (TW); Ming-Lung Wang, Taoyuan (TW); Hung-Wei Chen, Taoyuan (TW); Tung-Shiun Yang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/145,265

(22) Filed: Jan. 8, 2021

(51) Int. Cl.
*H05K 7/14* (2006.01)

(52) U.S. Cl.
CPC ......... *H05K 7/1489* (2013.01); *H05K 7/1487* (2013.01)

(58) Field of Classification Search
CPC .. H05K 7/1489; H05K 7/1487; H05K 7/1427; H05K 7/1429; H05K 7/1431; H05K 7/1461; H05K 7/1402; H05K 7/1408; H05K 5/0056; H05K 5/0213; H05K 5/061; G06F 1/185; G06F 1/186; G06F 1/187; G06F 1/181; Y10T 29/49615; G11B 33/04
USPC ...................................... 361/679.58
See application file for complete search history.

(56) References Cited

U.S. PATENT DOCUMENTS

| | | | | |
|---|---|---|---|---|
| 5,544,006 A * | 8/1996 | Radloff | ................... | G06F 1/184 174/138 G |
| 6,005,768 A * | 12/1999 | Jo | ........................... | G11B 33/08 360/99.18 |
| 6,078,504 A * | 6/2000 | Miles | ...................... | G06F 1/184 174/17 CT |
| 6,560,097 B2 * | 5/2003 | Naruo | ................ | G11B 33/1493 361/679.33 |
| 7,214,888 B1 * | 5/2007 | Feroli | ..................... | G06F 1/186 174/370 |
| 2002/0097556 A1 * | 7/2002 | Lee | ........................ | G11B 33/08 361/679.33 |
| 2004/0216909 A1 * | 11/2004 | Lloyd | .................. | H05K 9/0058 174/384 |
| 2009/0129002 A1 * | 5/2009 | Wu | ......................... | G06F 1/185 361/679.4 |
| 2012/0020037 A1 * | 1/2012 | Chiu | ...................... | G06F 1/185 361/759 |

* cited by examiner

*Primary Examiner* — Adrian S Wilson
*Assistant Examiner* — Gage Crum
(74) *Attorney, Agent, or Firm* — Nixon Peabody LLP

(57) ABSTRACT

A bracket for holding an electronic device in a carrier in a computing system is described. The bracket includes an outer plate and an inner compressible sleeve. The outer plate includes a front side and a back side. The inner compressible sleeve including a front section, a back section, and an aperture. The front section of the inner compressible sleeve is coupled to the back side of the outer plate. When the electronic device is inserted in the aperture, the electronic device compresses the inner compressible sleeve within the aperture. The bracket may also include a hole, on the outer plate, configured to mate with a fastener on the electronic device. The bracket also includes a protrusion on the outer plate. The protrusion prevents the electronic device from moving through the front side of the outer plate. The inner compressible sleeve of the bracket is a shock dampener.

20 Claims, 7 Drawing Sheets

TOOL-LESS INSTALLATION STRUCTURE FOR DUAL SLOT PCIE CARD

TECHNICAL FIELD

The present disclosure relates generally to an enclosure for a server system component, and more specifically, to a removable bracket for a riser module of a PCIe card that connects to the server system component.

BACKGROUND

Computer enclosures and other types of electronic equipment are often mounted in a vertical rack structure. Each rack structure has slots for holding the computer enclosures. Electronic equipment, such as a server, includes a chassis that contains components such as processors, power supplies, motherboards, and the like. The different chassis units in the rack structure may each contain a motherboard for slots for devices to enhance server capabilities, such as peripheral component interconnect express (PCIe) slots for PCIe devices. A typical data center may have hundreds of servers, and therefore thousands of PCIe slots.

The slots for PCIe devices within a single chassis may be arranged on a motherboard. Such PCIe devices will be in a form factor that may have a generally rectangular shape. The chassis may have apertures that allow external access to one side of the form factor of the PCIe device. The side of the form factor will generally include connectors that allow external connections to be made. The area of such connectors on a PCIe form factor is referred to as a keyhole. The keyhole assists the PCIe device in attaching to a riser in the system. The PCIe device cards may also be connected to a vertically oriented riser or a flexible extender, which is in turn inserted in the slot on the motherboard. Such risers or extenders allow the device card to be placed in a suspended horizontal position at a location over the motherboard. When a PCIe card is located in a riser or flexible extender, ports or adapters may be used for connection of the card to the riser. The height of the connector for the card may vary in generally when a riser or flexible extender is used. Additionally, PCIe cards come in different sizes and forms, generally ranging between the following: x1, x4, x8, x16, and x32 sizes. Therefore, not all sizes of PCIe cards fit into the risers and flexible extenders. Furthermore, the position of the keyhole on the PCIe card is not dictated by any specification and may change frequently as different card designs are introduced. Thus, changes in the size and shape may affect stability of the connection between the components of the PCIe card and external devices connected to the slots on the riser. For example, certain PCIe cards may result in features of the chassis potentially covering the keyhole or slot on the riser or not including enough space between the bracket assembly and the keyhole or slot on the riser for a secure connection.

Additionally, other server components such as fans may cause slight vibrations due to noise or physical movement. Thus, the PCIe card may move slightly when installed in a riser or flexible extender. Movements between the PCIe card and the riser or extender, or the keyhole connection may lead to a poor connection, reduced power consumption, overheating, or disconnection. Furthermore, the temperature of the PCIe card may increase due to power consumption while the PCIe card is in use.

Thus, there exists a need for a bracket assembly for PCIe riser or flexible extender that allows for variations in sizes and shapes of a PCIe device card. There is also a need for a bracket assembly that can maintain a secure connection in case of movement of a PCIe device card. There is also a need for a bracket assembly that can withstand higher temperatures for prolonged periods of time.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a bracket for holding an electronic device in a carrier in a computing system is described. The bracket includes an outer plate and an inner compressible sleeve. The outer plate includes a front side and a back side. The inner compressible sleeve includes a front section, a back section, and an aperture. The front section of the inner compressible sleeve is coupled to the back side of the outer plate. When the electronic device is inserted in the aperture, the electronic device compresses the inner compressible sleeve within the aperture.

According to a configuration of the above implementation, the bracket may also include a hole on the outer plate. The hole is configured to mate with a fastener on the electronic device.

According to another configuration of the above implementation, the bracket also includes a protrusion on the outer plate. The protrusion prevents the electronic device from moving through the front side of the outer plate.

In a further aspect of the above implementation, the inner compressible sleeve of the bracket is a shock dampener.

In another aspect of the above implementation, the outer plate is coupled to the inner compressible sleeve of the bracket via an adhesive.

According to another configuration of the above implementation, the inner compressible sleeve of the bracket is configured to insulate the electronic device in the carrier from heat produced by the system.

In a further aspect of the above implementation, the outer plate of the bracket is metal.

In yet a further aspect of the above implementation, the inner compressible sleeve of the bracket is rubber.

Another aspect of the present disclosure includes an electronic device assembly. The assembly includes an electronic device, a bracket, and carrier. The bracket has an outer plate and an inner compressible sleeve. The outer plate includes a front side and a back side. The inner compressible sleeve includes a front section, a back section, and an aperture. The front section of the inner compressible sleeve is coupled to the back side of the outer plate. When the electronic device is inserted in the aperture, the electronic device compresses the inner compressible sleeve within the aperture. The carrier for holding the electronic device and the bracket.

According to a configuration of the above implementation, the assembly may also include a hole on the outer plate. The hole is configured to mate with a fastener on the electronic device.

According to another configuration of the above implementation, the assembly also includes a protrusion on the outer plate. The protrusion prevents the electronic device from moving through the front side of the outer plate.

In a further aspect of the above implementation, the inner compressible sleeve of the bracket is a shock dampener.

In another aspect of the above implementation, the outer plate is coupled to the inner compressible sleeve of the bracket via an adhesive.

According to another configuration of the above implementation, the inner compressible sleeve of the bracket is configured to insulate the electronic device in the carrier from heat produced by the system.

In a further aspect of the above implementation, the outer plate of the bracket is metal.

In yet a further aspect of the above implementation, the inner compressible sleeve of the bracket is rubber.

Another aspect of the present disclosure includes a computing system having a riser for holding an electronic component in a carrier. The system includes a riser, an electronic device, a bracket, and a carrier. The riser includes a top wall, a bottom wall, two side walls, an electronic device, and a bracket. The top wall and the bottom wall are perpendicularly coupled to the two side walls. The top wall is approximately parallel to the bottom wall. The bracket includes an outer plate and an inner compressible sleeve. The outer plate includes a front side, a back side, and a hole. The inner compressible sleeve includes a front section, a back section, and an aperture. The front section of the inner compressible sleeve is coupled to the back side of the outer plate. When the electronic device is inserted in the aperture, the electronic device compresses the inner compressible sleeve within the aperture. The carrier for holding the electronic device and the bracket is configured to be removably coupled to one of the side walls of the riser, and the other side wall of the riser is configured to be removably coupled to the electronic device.

According to another configuration of the above implementation, the assembly also includes a protrusion on the outer plate. The protrusion prevents the electronic device from moving through the front side of the outer plate.

In a further aspect of the above implementation, the inner compressible sleeve of the bracket is a shock dampener.

In another aspect of the above implementation, the outer plate is coupled to the inner compressible sleeve of the bracket via an adhesive.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
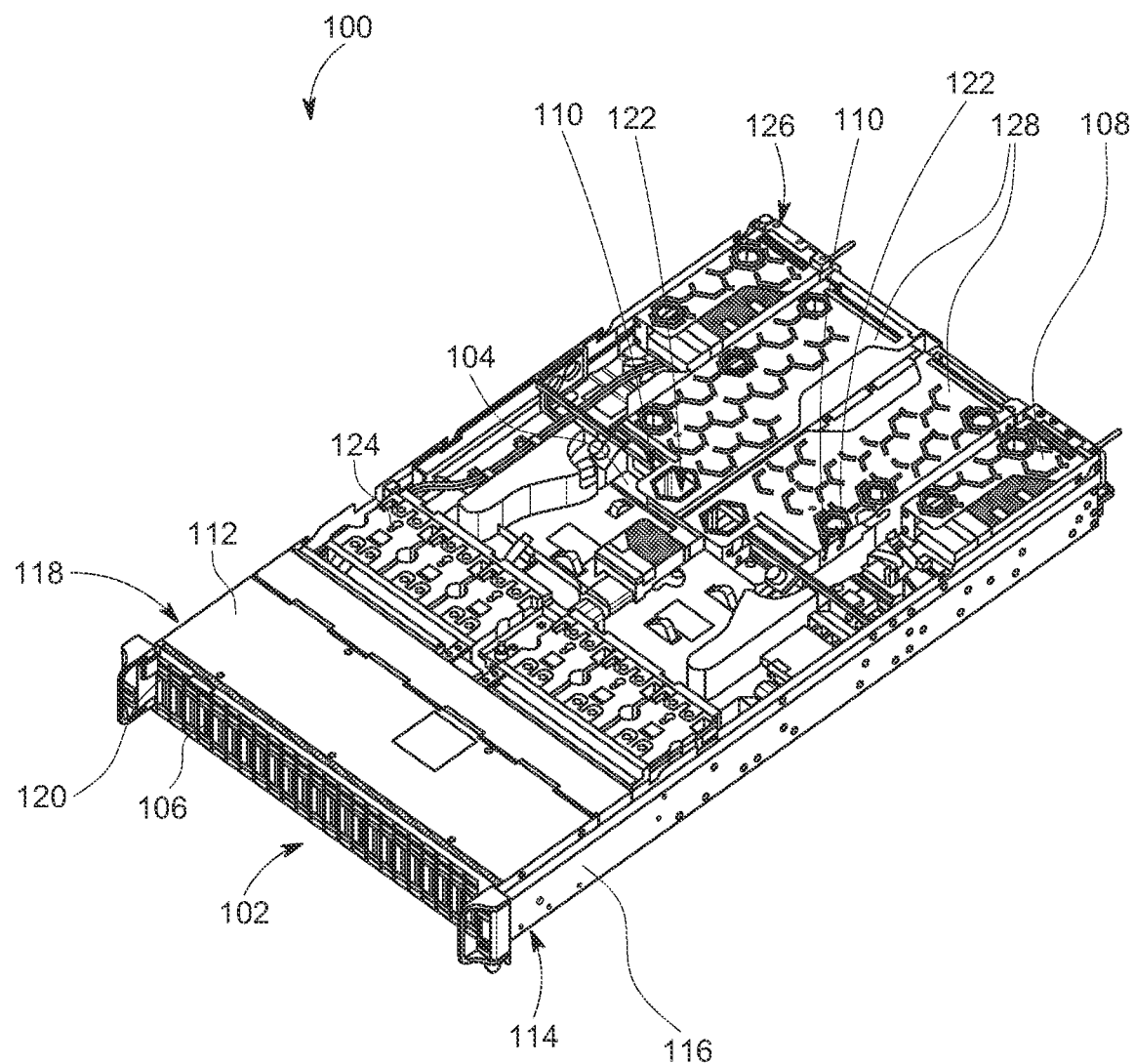
FIG. 1 is a perspective view of a computing system with example bracket assemblies inserted in a riser module of the chassis of the computing system.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." More-over, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed to a bracket for an expansion card in a carrier that, among other benefits, provides for easy installation and removal of the expansion card from the carrier, accommodates variations in size and shape of the expansion card, and may be reused multiple times.

FIG. 1 illustrates a computing system, such as a server system 100, having a chassis 102, a motherboard 104, a memory device 106, a power supply 108, a bracket assembly 110, a riser support 122, a riser module 128, and a fan wall 124. In other implementations, the server system 100 may include more than the listed components or less than the listed components. The chassis 102 includes a top panel 112, a bottom panel 114, a first side wall 116, a second side wall 118, a front wall 120, and a back wall 126 to enclose the electronic components of the system 100.

In some implementations, the riser module 128 is located on the back wall 126 of the chassis 102. There may be one or more riser modules 128 located in the chassis 102. The riser module 128 may include one or more riser supports 122 with bracket assemblies 110 stacked in the riser module 128, where the bracket assemblies 110 may be coupled to the riser supports 122. As will be explained, the bracket assembly 110 includes a bracket and an expansion card. The riser support 122 includes an open end that faces an open end of the chassis 102 to allow for additional connections between an expansion card in the riser support 122. The riser supports 122 may be stacked vertically within the riser module 128, between the top wall 112 and the bottom wall 114 of the chassis 102. In some implementations, the riser supports 122 may be considered slots, holders, containers, receptacles, slits, apertures, or openings. There may also be riser supports 122 aligned next to each other horizontally within the riser module 128, between the first wall 116 and the second wall 118 of the chassis 102, as shown in FIG. 1. The riser support 122 may also be called a carrier, which is used to hold a bracket assembly 110. The bracket assembly 110 may be positioned within the riser support 122 such that the bracket assembly 110 securely fits within the riser support 122.

In some implementations, the riser support 122 may interface with other types of expansion cards, such as graphic processing units, Integrated Processing Units, Accelerated Graphics devices, or other types of Peripheral Component Interconnect (PCI) cards. The riser support 122 may allow for the system 100 to enhance its capabilities, such as having better sound and video, higher bandwidth, greater flexibility, and faster performance, by providing a connection for the server 100 to interface with expansion electronic components providing these functions.

Figure 2:
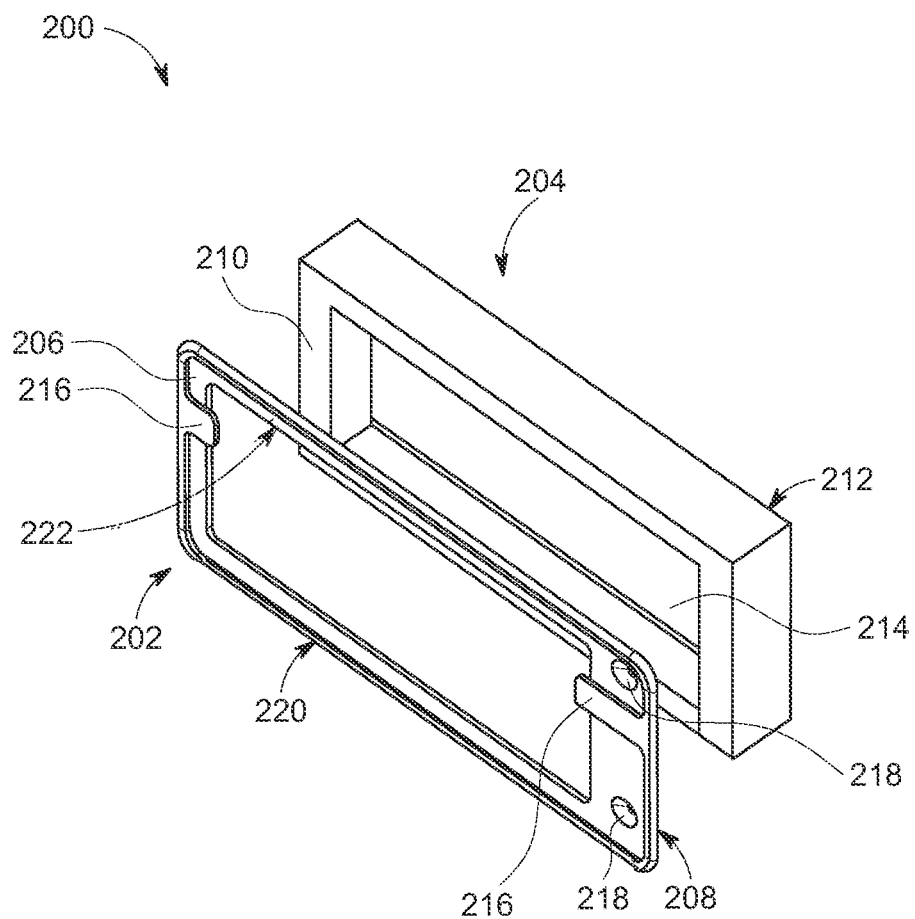
FIG. 2 is a perspective view of an example bracket that may hold different sized device cards.

FIG. 2 is an exploded view of a bracket 200 that is one component of the bracket assembly 110 in the system 100 (shown in FIG. 1). The bracket 200 may include an outer plate 202 and an inner compressible sleeve 204. The outer plate 202 may include a front side 206 and a back side 208. The outer plate 202 may also include protrusions 216, holes 218, a frame 220, and an inner rectangular edge 222 that defines a rectangular aperture. The outer plate 202 may be fabricated from a ductile, flexible, malleable, insulative, and heat resistant material that may temporarily deflect while maintaining its structural integrity when pressure is applied.

In other implementations, the outer plate 202 may be made of a metal sheet such as steel, tin, aluminum, nickel, brass, copper, and titanium.

The inner compressible sleeve 204 is a generally rectangular shape. The frame 220 of the outer plate 202 is a generally rectangular shape. The holes 218 of the outer plate 202 are a generally circular shape. The holes 218 may be threaded in order to mate with a threaded fastener. In other implementations, the holes 218 may be a hole or opening in the outer plate 202 without threads. In some implementations, the holes 218 may include a reinforced area around the perimeter to increase the maximum pressure that the holes 218 may withstand. In some implementations, there may be more than two protrusions 216 on the outer plate 202. In some implementations, there may be other holes similar to the holes 218 on the outer plate 202 to provide additional support for an attached carrier.

The protrusions 216 of the outer plate 202 may extend from the inner rectangular edge 222. The frame 220 follows the general outer perimeter shape of the outer plate 202. The frame 220 protrudes from the outer perimeter of the front side 206. The function of the frame 220 may be to provide additional, reinforcing structural support for the outer plate 202. The function of the frame 220 may also be to provide a contact for a user to grip when manipulating the outer plate 202. The holes 218 of the outer plate 202 may accommodate a fastener attached to a carrier. The fasteners inserted in the holes 218 may include a screw, a nut and bolt, a threaded insert, a threaded a rod, an anchor, and a rivet.

The inner compressible sleeve 204 may include a front section 210, a back section 212, and an aperture 214. The front section 210 of the inner compressible sleeve 204 may be connected to the back side 208 of the outer plate 202 using an adhesive—such as glue, cyanoacrylate, epoxy, or resin, a heat treatment, a tying method, or another method for permanently or removably connecting the outer plate 202 and the inner compressible sleeve 204. The inner compressible sleeve 204 may be extruded, three-dimensionally printed, or injection molded from a rubber or sponge material—such as isoprene, styrene-butadiene, silicone, nitrile, ethylene propylene diene monomer, butyl, polyurethane, polyester, or vegetal cellulose, or neoprene. The material of the inner compressible sleeve 204 may provide resistance to reduce slippage when a force is applied against it. The material of the inner compressible sleeve 204 may also be flexible, malleable, and insulative. The distance between the front section 210 and the back section 212 may be such that a PCIe card may securely fit into the aperture 214. The inner compressible sleeve 204 has a shorter width than the outer plate 202. Thus, the section of the outer plate 202 with the holes 218 does not overlap the inner compressible sleeve 204 when the bracket 200 is assembled.

Figure 3A:
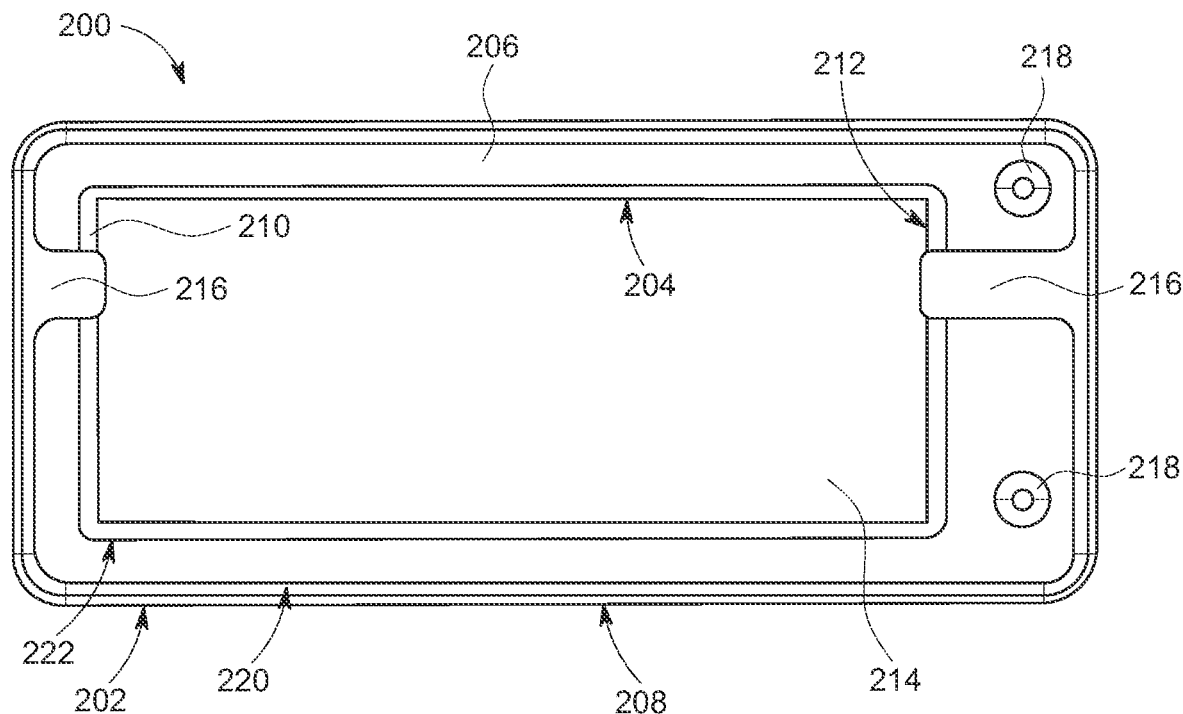
FIG. 3A is a front view of the example bracket of FIG. 2.
Figure 3B:
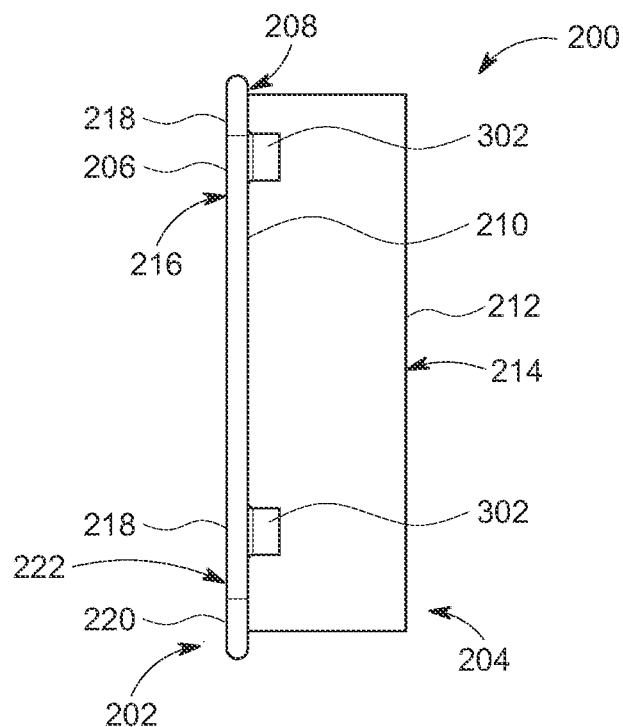
FIG. 3B is a side view of the example bracket of FIG. 3A.

FIG. 3A is a front view and FIG. 3B is a side view of the bracket 200 when the outer plate 202 and the inner compressible sleeve 204 are assembled together. Like elements in FIG. 2 are labeled with the same reference numbers in FIGS. 3A-3B. Referring to FIGS. 3A-3B, the bracket 200 may include the outer plate 202 and the inner compressible sleeve 204 connected to each other. The connection may be such that the vertical and horizontal distances between the inner rectangular edge 222 of the outer plate 202 and the aperture 214 of the inner compressible sleeve 204 is approximately equal based on the view in FIG. 3A. As shown in FIG. 3A, the inner compressible sleeve 204 may be seen from the front of the bracket 200. Thus, the perimeter of the aperture 214 of the inner compressible sleeve 204 may be less than the perimeter of the inner rectangular edge 222 of the outer plate 202. Furthermore, the protrusions 216 of the outer plate 202 prevents the inner compressible sleeve 204 from moving to a position extending out from the front side 206 of the outer plate 202. Thus, the protrusions 216 prevent the inner compressible sleeve 204 from slipping or being displaced relative to the outer plate 202. The inner rectangular edge 222 defines the opening in the outer plate 202, and may follow the entirety of the shape of the opening except for the protrusions 216. The aperture 214 outlines an opening in the inner compressible sleeve 204, and follows the entirety of the shape of the opening.

As shown in FIG. 3B, the outer plate 202 abuts the inner compressible sleeve 204. The overall surface area of the inner compressible sleeve 204 is less than the overall surface area of the outer plate 202 such that the outer plate 202 overlaps the entirety of the front surface of the outer plate 202. The height alignment may be such that the distance between the top and bottom of the frame 220 of the outer plate 202 and the top and bottom of the aperture 214 of the inner compressible sleeve 204 is approximately equal based on the view in FIG. 3B. The holes 218 of the outer plate 202 extend from the front side 206 through the outer plate 202 and protrude through additional support members 302 that extend from the back side 208. In some implementations, the holes 218 do not protrude through the back side 208 of the outer plate 202. From a side profile, the inner compressible sleeve 204 is in a generally rectangular shape.

Figure 4:
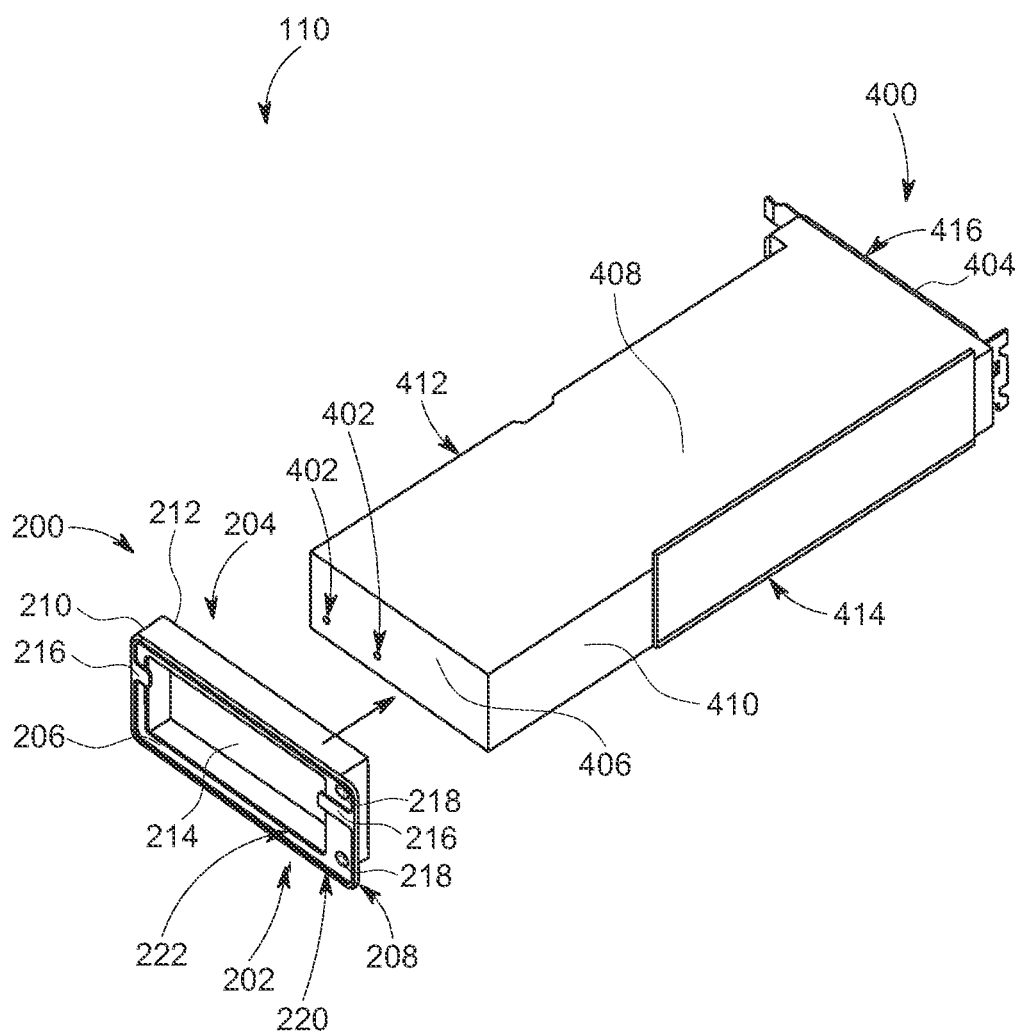
FIG. 4 is a perspective view of the example bracket of FIGS. 3A-3B before it is attached to an expansion card.

FIG. 4 is a perspective view of the bracket 200 before it is attached to an expansion card 400 to form the bracket assembly 110. Like elements in FIGS. 2-3B are labeled with the same reference numbers in FIG. 4. The expansion card 400 includes a front face 406, a back face 416, a first side face 408, a second side face 410, a third side face 412 and a fourth side face 414. A keyhole area 402 is located on the front face 406 of the expansion card 400. The keyhole area 402 may be used to assist a user in installing a bracket 200 in a riser support 122 (shown in FIG. 1). An attachment 404 is located on the back face 416 of the expansion card 400. The attachment 404 can be used to stabilize the expansion card 400 within the riser support 122 (shown in FIG. 1) in case of any excess vibration around the bracket 200. The third side face 412 includes an edge connector that connects to a slot on the riser module 128 (shown in FIG. 1). The expansion card 400 may be any suitable expansion card, including a graphics processing unit (GPU) card, a redundant array of inexpensive disks (RAID) card, a network controller card such as a network interface controller or Wi-Fi card, a hard disk drive, or a solid-state drive, Integrated Processing Units, Accelerated Graphics devices, or other types of Peripheral Component Interconnect (PCI) cards. In this example, the expansion card 400 is a PCIe card. The expansion card 400 may vary in size and shape, depending on the capacity, function, brand, and specification of the specific expansion card. Thus, the inner compressible sleeve 204 may accommodate variations in size and shape of the expansion card 400 because of the flexibility of the material.

The bracket 200 may be installed on the expansion card 400 to form the bracket assembly 110. During installation, the back section 212 of the inner compressible sleeve 204 first engages with the front face 406 of the expansion card 400, such that the aperture 214 of the inner compressible sleeve 204 abuts the first side face 408, the second side face 410, the third side face 412 and the fourth side face 414 of the card 400. Thus, the expansion card 400 may be inserted through the aperture 214. When inserted, the expansion card 400 compresses the inner compressible sleeve 204 within the aperture 214.

After the bracket 200 is installed on the expansion card 400, the back side 208 of the outer plate 202 may abut the front face 406 of the expansion card 400 because the expansion card 400 compresses the inner compressible sleeve 204 expanding the size of the aperture 214. Furthermore, the protrusions 216 of the outer plate 202 prevent the expansion card 400 from extending through the front side 206 of the outer plate 202. In some implementations, the section of the front side 206 with the holes 218 do not overlap the front side 406 of the expansion card 400. In some implementations, the keyhole area 402 may be accessed through the opening defined by the frame 222.

Figure 5:
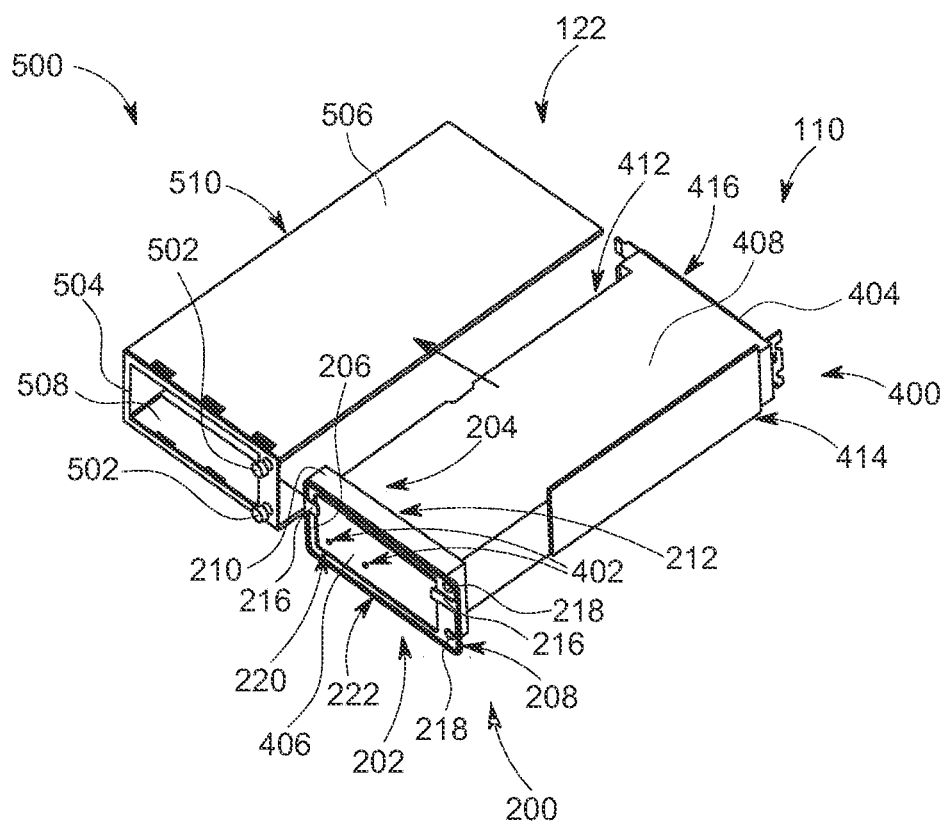
FIG. 5 is a perspective view of an example bracket assembly of the bracket and expansion card in FIG. 4 before installation into a riser support.

FIG. 5 is a perspective view of the bracket assembly 110 installed into a riser support 122. Like elements in FIGS. 1-4 are labeled with the same reference numbers in FIG. 5. The bracket assembly 110 includes the bracket 200 and the attached expansion card 400. The riser support 122 may include fasteners 502, a front frame 504, a top support panel 506, a bottom support panel 508, and a side panel 510. The bracket assembly 110 may be installed into the riser support 122 such that the front side 206 of the outer plate 202 and the front face 406 of the expansion card 400 are parallel and adjacent to the front frame 504 of the riser support 122. When assembled, the first side face 408 of the expansion card 400 is parallel and adjacent to the top support panel 506 of the riser support 122, and the fourth side face 414 of the expansion card 400 may be parallel and adjacent to the side panel 508 of the riser support 122. The third side face 412 of the expansion card 400 is parallel and adjacent to the bottom panel 510 of the riser support 122.

In some implementations, the riser support 122 does not block access to the attachment 404 of the expansion card 400. Thus, the riser support 122 allows for the attachment 404 to abut a different component or to include internal connections to other sections of the system 100 (shown in FIG. 1). The front frame 504 includes a side that has holes to hold the fasteners 502. The fasteners 502 may be thumb screws that permit a user to secure the fastener 502 with the user's hand rather than requiring the use of a tool. Furthermore, the holes 218 of the outer plate 202 may align with the fasteners 502 of the riser support 122 after the bracket assembly 110 is installed into the riser support 122. A riser assembly 500 includes the bracket assembly 110 installed into the riser support 122.

Figure 6A:
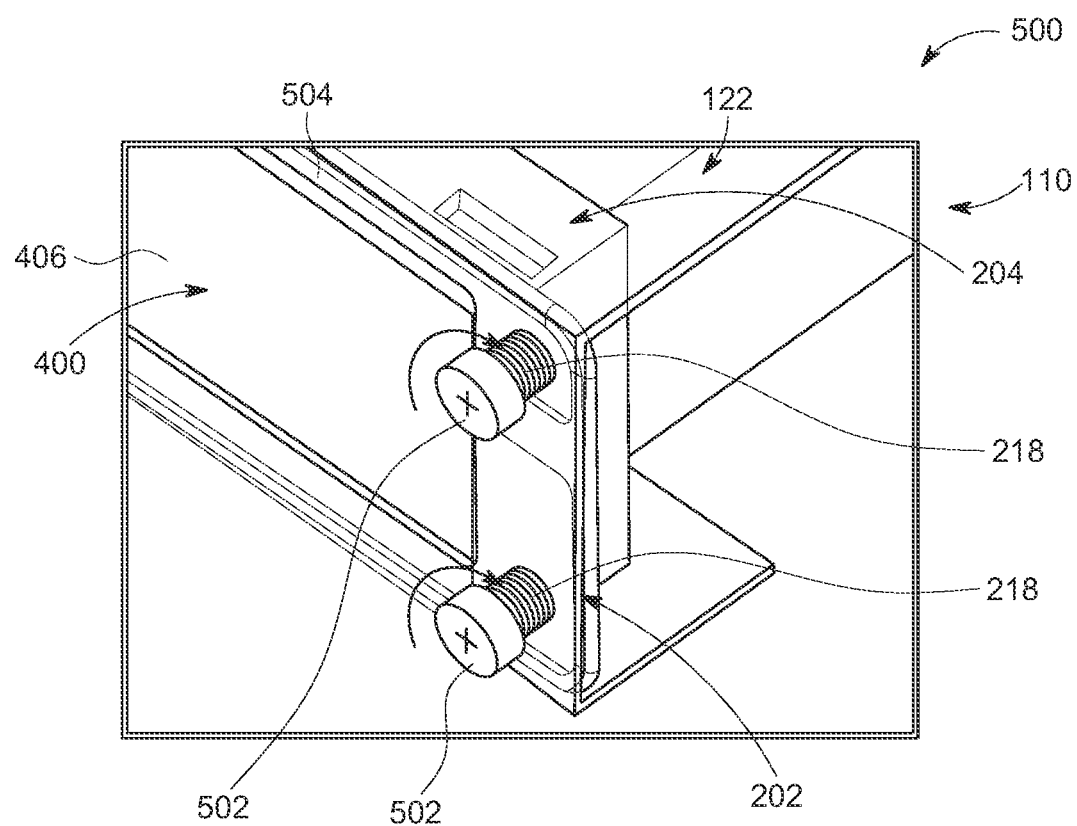
FIG. 6A is a perspective view of the example bracket assembly of FIG. 5 being secured onto a riser support.

FIG. 6A is a perspective view of the bracket assembly 110 being secured onto a riser support 122 to form the riser assembly 500. Like elements in FIGS. 1-5 are labeled with the same reference numbers in FIGS. 6A-6B. After a user aligns the fasteners 502 with the holes 218, the user may manually secure the fastener 502 in place by hand. The fasteners 502 may include a fastener that does not require a tool to install, such as a screw, a nut-and-bolt assembly, a quarter-turn pin, a knob-locking pin, a button-locking pin, a ball-lock clamping pin, and a magnet-lock clamping pin. Thus, the bracket assembly 110 may be removably secured in the riser support 122. In the secured position, the front face 406 of the expansion card 400 is exposed through the front frame 504 of the riser support 122. Therefore, other components or sections of the system 100 (shown in FIG. 1) may access components on the front face 406 of the expansion card 400.

Figure 6B:
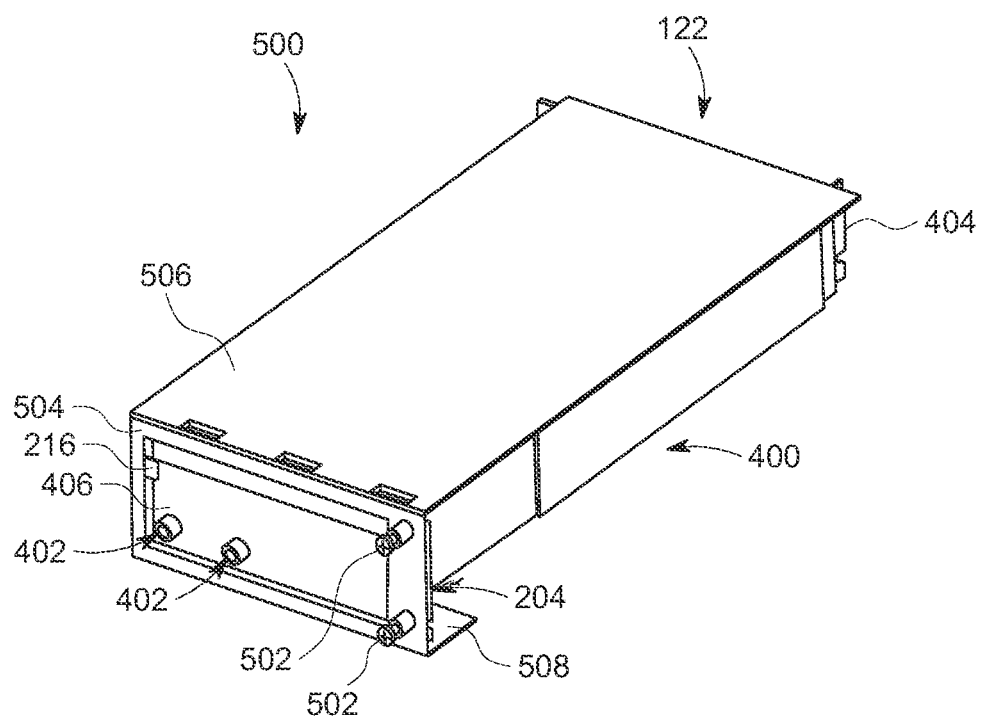
FIG. 6B is a perspective view of the example assembly of the riser support, expansion card, and bracket assembly of FIG. 6A.

FIG. 6B is a perspective view of the riser assembly 500 in an installed, secured position. The attachment 404 of the expansion card 400 may be accessed by the riser support 122. Thus, the attachment 404 may be internally connected to other components in the system 100 (shown in FIG. 1). Similarly, the keyhole area 402 of the expansion card 400 is not obstructed by the riser support 122, thus, allowing for other connections to be made externally to the system 100 or the riser module 128 (both shown in FIG. 1). In the installed position, the material of the inner compressible sleeve 204 allows for some compression and variance as to the expansion card 400. Thus, the inner compressible sleeve 204 may function as a dampener and absorb mechanical vibrations caused by physical movements or noise in relation to the expansion card 400. Furthermore, the inner compressible sleeve 204 may also insulate heat from the expansion card 400 such that it does not transfer to the riser support card 122, thereby assisting to keep the temperature of the riser support 122 relatively low.

Figure 7A:
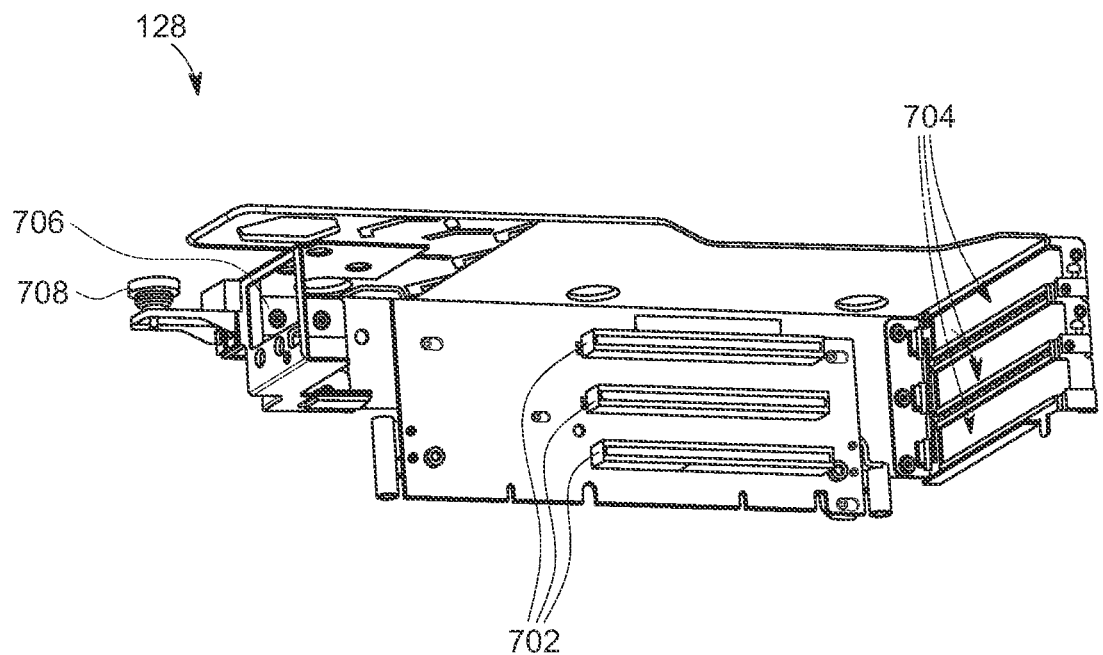
FIG. 7A is a perspective bottom view of an example riser module.

FIG. 7A is a perspective bottom view of the riser module 128. The riser module 128 includes slots 702 for insertion of connectors of an expansion card. The slots 702 are coupled to electrical connections to the different components on the motherboard 104 (shown in FIG. 1). The riser module 128 also includes frames 704, each of which stabilizes an expansion card in the riser module 128. The components may be inserted in the frames 704. In some implementations, each of the system frames 704 corresponds to one of the slots 702 in the riser module 128. The riser module 128 includes a brace 706 for providing structural support when a keyhole of an expansion card is connected to the riser module 128. A lock 708 provides support for the riser module 128 to be secured in a system chassis.

Figure 7B:
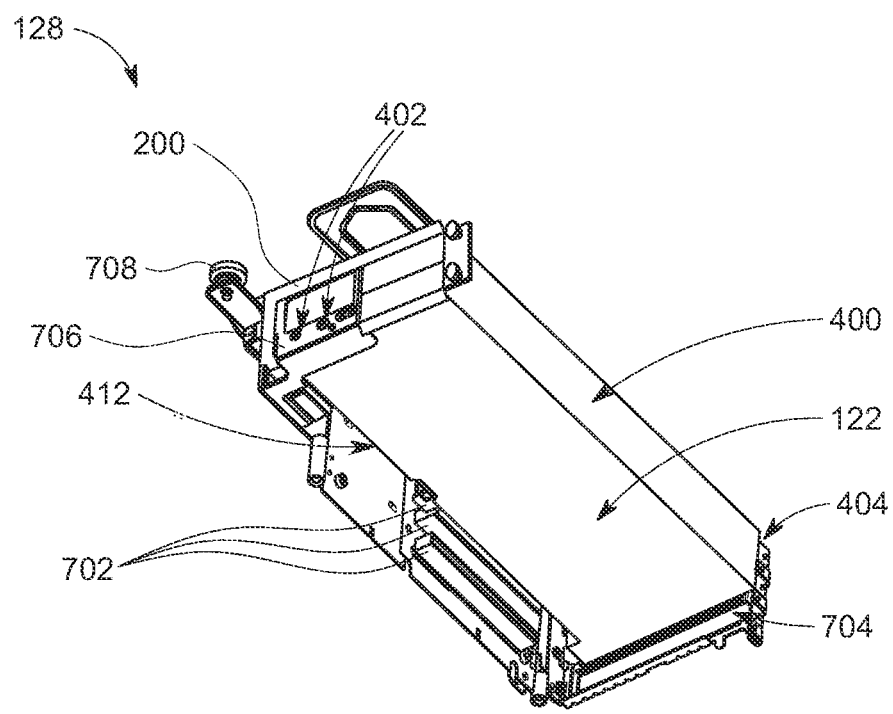
FIG. 7B is a perspective bottom view of the example riser module of FIG. 7A with a riser support, expansion card, and bracket assembly installed into the riser module.

FIG. 7B is a perspective bottom view of the riser module 128 of FIG. 7A with an installed riser support 122, expansion card 400, and bracket 200. The bracket 200 may be included in the riser module 128 in order to properly fit a different sized expansion card 400 such that variations in size may be accommodated in the riser module 128. An implementation with a bracket 200 includes a connection to the brace 706 in order to secure the bracket 200 to the brace 706 through the keyhole area 402 of the expansion card 400. The keyhole area 402 may be secured to the brace 706 via fasteners attached with a tool or a user's fingers. The fastener may be a screw, a nut and bolt, a threaded insert, a threaded rod, an anchor, or a rivet. As shown in FIG. 7B, the brace 706 is connected to the riser support 122 in order to secure the riser support 122 within the riser module 128. On the opposite end of the brace 706, the frames 704 provide another way for the riser support 122 to be stabilized in the system because the expansion card 400 includes the attachment 404 exposed through the frames 704 to allow for mechanical fastening. The third side face 412 of the expansion card 400 includes the edge connector that interfaces with the slots 702 of the riser module 128. The signal from the expansion card 400 is electrically connected to the slots 702, which is electrically connected to the motherboard 104 (shown in FIG. 1). Thus, signals from the expansion card 400 are transmitted to the motherboard 104 (shown in FIG. 1) from the slots 702 of the riser module 128.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A bracket for holding an electronic device in a carrier in a computing system, the bracket comprising:
an outer plate including a front side and a back side; and
an inner compressible sleeve including a front section, a back section, and an aperture, wherein the front section of the inner compressible sleeve is coupled to the back side of the outer plate, and wherein when the electronic device is inserted in the aperture, the electronic device compresses the inner compressible sleeve within the aperture, the aperture having an outline with a first sleeve size prior to insertion of the electronic device into the aperture, the outline having a second sleeve size after insertion of the electronic device into the aperture, the second sleeve size being greater than the first sleeve size, the second sleeve size resulting from elasticity of the inner compressible sleeve and being caused by a shape mismatch with the electronic device.

2. The bracket of claim 1, further comprising a hole on the outer plate, wherein the hole is configured to mate with a fastener on a riser configured to hold the electronic device.

3. The bracket of claim 1, further comprising a protrusion on the outer plate, wherein the protrusion prevents the electronic device from moving through the front side of the outer plate.

4. The bracket of claim 1, wherein the inner compressible sleeve of the bracket is a shock dampener.

5. The bracket of claim 1, wherein the outer plate is coupled to the inner compressible sleeve of the bracket via an adhesive.

6. The bracket of claim 1, wherein the inner compressible sleeve of the bracket is configured to insulate the electronic device in the carrier from heat produced by the system.

7. The bracket of claim 1, wherein the outer plate of the bracket is metal.

8. The bracket of claim 1, wherein the inner compressible sleeve of the bracket is rubber.

9. An electronic device assembly comprising:
an electronic device;
a riser for holding the electronic device;
a bracket having an outer plate and an inner compressible sleeve, wherein:
the outer plate includes a front side and a back side; and
the inner compressible sleeve includes a front section, a back section, and an aperture, wherein the front section of the inner compressible sleeve is coupled to the back side of the outer plate, and wherein when the electronic device is inserted in the aperture, the electronic device compresses the inner compressible sleeve within the aperture, the aperture having an outline with a first sleeve size prior to insertion of the electronic device into the aperture, the outline having a second sleeve size after insertion of the electronic device into the aperture, the second sleeve size being greater than the first sleeve size, the second sleeve size resulting from elasticity of the inner compressible sleeve and being caused by a shape mismatch with the electronic device; and
a carrier for holding the electronic device and the bracket.

10. The assembly of claim 9, further comprising a hole on the outer plate, wherein the hole is configured to mate with a fastener on the riser.

11. The assembly of claim 9, further comprising a protrusion on the outer plate, wherein the protrusion prevents the electronic device from moving through the front side of the outer plate.

12. The assembly of claim 9, wherein the inner compressible sleeve of the bracket is a shock dampener.

13. The assembly of claim 9, wherein the outer plate is coupled to the inner compressible sleeve of the bracket via an adhesive.

14. The assembly of claim 9, wherein the inner compressible sleeve of the bracket is configured to insulate the electronic device in the carrier from heat produced by the system.

15. The assembly of claim 9, wherein the outer plate of the bracket is metal.

16. The assembly of claim 9, wherein the inner compressible sleeve of the bracket is rubber.

17. A computing system having a riser for holding an electronic component in a carrier, the system comprising:
a riser for holding an electronic device, the riser including:
a top wall,
a bottom wall, and
two side walls, wherein the top wall and the bottom wall are perpendicularly coupled to the two side walls, and wherein the top wall is approximately parallel to the bottom wall;
an electronic device;
a bracket having an outer plate and an inner compressible sleeve, wherein:
the outer plate includes a front side, a back side, and a hole; and
the inner compressible sleeve includes a front section, a back section, and an aperture, wherein the front section of the inner compressible sleeve is coupled to the back side of the outer plate, and wherein when the electronic device is inserted in the aperture, the electronic device compresses the inner compressible sleeve within the aperture, the aperture having an outline with a first sleeve size prior to insertion of the electronic device into the aperture, the outline having a second sleeve size after insertion of the electronic device into the aperture, the second sleeve size being greater than the first sleeve size, the second sleeve size resulting from elasticity of the inner compressible sleeve and being caused by a shape mismatch with the electronic device; and
a carrier for holding the electronic device and the bracket, wherein the carrier is configured to be removably coupled to one of the side walls of the riser and the other side wall of the riser is configured to be removably coupled to the electronic device.

18. The system of claim 17, further comprising a protrusion on the outer plate, wherein the protrusion prevents the electronic device from moving through the front side of the outer plate.

19. The system of claim 17, wherein the inner compressible sleeve of the bracket is a shock dampener.

20. The system of claim 17, wherein the outer plate is coupled to the inner compressible sleeve of the bracket via an adhesive.

* * * * *